United States Patent [19]

Lehning

[11] Patent Number: 4,697,155
[45] Date of Patent: Sep. 29, 1987

[54] HIGH VOLTAGE AMPLIFIER

[75] Inventor: Heinz Lehning, Nyon, Switzerland

[73] Assignee: Motorola, Inc., Schaumburg, Ill.

[21] Appl. No.: 853,799

[22] Filed: Apr. 17, 1986

[30] Foreign Application Priority Data

May 10, 1985 [GB] United Kingdom ............... 8511865

[51] Int. Cl.[4] .............................................. H03F 3/04
[52] U.S. Cl. ................................... 330/297; 330/300;
330/311
[58] Field of Search .................... 330/70, 71, 261, 297,
330/300, 310, 311

[56] References Cited

U.S. PATENT DOCUMENTS 3,024,422 3/1962 Jansson ............................. 330/297

OTHER PUBLICATIONS

Leitman et al., "A High Voltage DC Amplifier Stage", *Instruments and Experimental Techniques*, vol. 19, No. 2, Pt. 1, Mar.–Apr. 1976, pp. 443–445.

Primary Examiner—James B. Mullins
Attorney, Agent, or Firm—Eugene A. Parsons

[57] ABSTRACT

An integrated high voltage amplifier output stage capable of being manufactured using low voltage processes comprises a plurality of low-voltage amplifying means (8–21), such as a chain of Darlington transistor pairs, connected between a relatively high voltage source (36) and a current source (34) to provide a common output (35). A potential divider network (1–7) is connected between the high voltage source (36) and a protective high voltage FET (30) for providing low voltage inputs to each of the amplifying means. The input signal to the potential divider network (1–7) is then provided from a cascode stage made up of a low voltage transistor (29) and the high voltage FET (30), all the components being produced by a low voltage process.

18 Claims, 3 Drawing Figures

HIGH VOLTAGE AMPLIFIER

This invention relates to high voltage amplifiers, especially integrated high voltage amplifiers, and more particularly to an output stage for an integrated high voltage amplifier.

In recent years, bipolar IC processes with shallow epitaxial layers (e.g. 1.5 microns) and lateral oxide isolation have become increasingly popular. These processes allow high component density, high transient frequencies of the transistors and permit the integration of analog and digital circuitry.

The main disadvantage for analog applications, however, is that the breakdown voltages of the transistors are very small so that it has been necessary to use bulky high voltage transistors for building high voltage amplifiers.

Some attempts have been made to build operational amplifiers using relatively low-voltage processes. One such technique has been to provide a blocking diode and a cascode transistor so as to increase the operating range of an IC current source. However, this technique does not solve the problems on an oxide isolated very shallow process where the breakdown voltages are very small.

Another technique provides a bipolar transistor merged with an epi-JFET. This structure is called a gate underlaid transistor but it only functions properly when the collector-emitter breakdown voltage of the bipolar part is higher than the threshold voltage of the FET section and so does not provide a completely integrated amplifier.

It is therefore an object of the present invention to provide a high voltage amplifier output stage using only low voltage components which will overcome at least some of the disadvantages mentioned above.

Accordingly the invention provides a high voltage amplifier output stage comprising a plurality of low voltage amplifying means connected between a relatively high voltage source and a current source to provide a common output, means for providing a low voltage input to each of the amplifying means, and means including a low voltage transistor connected to supply an input signal to said amplifying means via a high voltage FET which protects said low voltage transistor from high voltages.

The output stage is preferably integrated, with the amplifying means, the low voltage transistor and the high voltage FET all being produced by a low voltage process.

The FET is preferably a JFET and may form a first cascode stage with the low voltage transistor.

The amplifying means are preferably connected in a chain.

Preferably, the means for providing a low voltage input to each of said amplifying means comprises a potential divider network connected between the relatively high voltage source and said high voltage FET and having a plurality of taps providing inputs to each of the amplifying means, the number of amplifying means being such that the collector-emitter breakdown voltage of each of the amplifying means is not exceeded.

Each amplifying means preferably includes semiconductor amplifying means such as a transistor and, in a preferred embodiment, comprises a Darlington transistor pair.

The potential divider network preferably comprises a plurality of resistors connected in series, the divider network being tapped between the resistors to provide inputs to each of the Darlington transistor pairs.

The Darlington transistor pairs are preferably connected such that the collectors of one Darlington pair are connected to the respective emitters of the next Darlington pair, with the collectors of a first Darlington pair being connected to the relatively high voltage source and the emitters of a last Darlington pair being connected to the output.

A biasing resistor is preferably also connected between one of the emitters of the last Darlington pair and the output.

The means for supplying an input signal to said amplifying means preferably further comprises a second transistor whose base is connected to the signal input, whose collector is connected to a low voltage source and whose emitter provides an input to the base of said low voltage transistor.

A second cascode stage may also be provided between the chain of low voltage amplifying means and the current source.

The second cascode stage may also conveniently comprise one JFET and one bipolar transistor, the bipolar transistor in this case forming part of a current mirror provided between the current source and the JFET.

In a preferred embodiment of a high voltage amplifier output stage, a further transistor is provided in the first cascode stage between the JFET and the low voltage transistor, the base of the transistor being connected to the low voltage source via a resistor.

In a similar manner a further transistor and resistor may also be connected in the second cascode stage if desired. The reasons for providing these transistors and resistors will be explained below.

An operational amplifier may be formed comprising a high voltage amplifier output stage of the type described above and a transconductance stage with a differential input, the output of the transconductance stage providing an input to the high voltage amplifier output stage. The current source may be replaced by a chain of resistors connected to the high voltage source and the low voltage source may be replaced by a chain of transistors and a zener diode, the chain of transistors being supplied by the chain of resistors which serves as a potential divider network providing inputs to the transistors.

One high voltage amplifier output stage according to the invention will now be more fully described by way of example with reference to the drawings of which:

Figure 1:
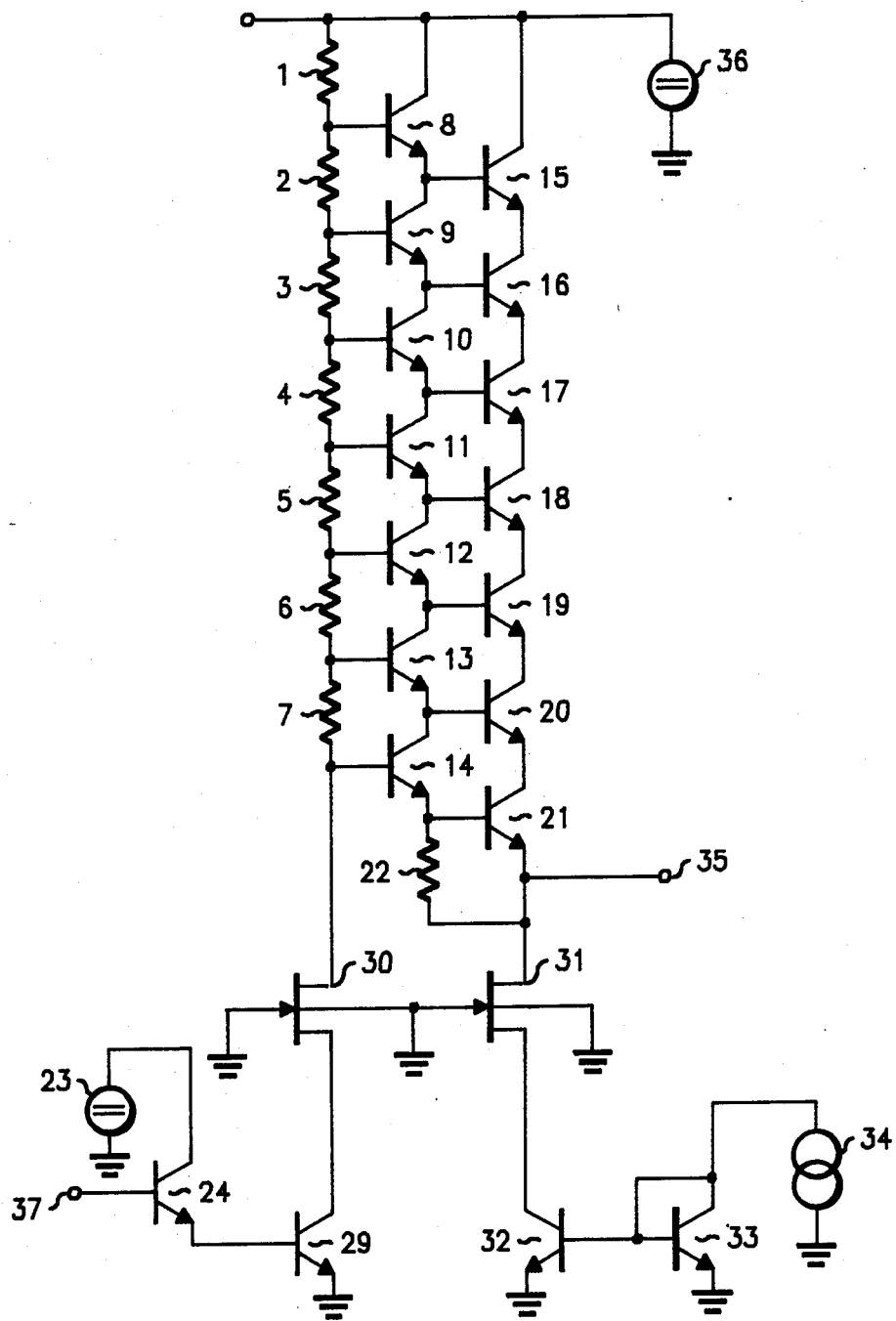
FIG. 1 is a circuit diagram of one high voltage amplifier output stage.

Referring first to FIG. 1, a high voltage amplifier stage has a signal input 37 and an output 35. The input 37 is applied to the base of a transistor 24 whose collector is connected to a low voltage source 23. The transistor 24 is connected to a second transistor 29 and together the transistors 24 and 29 serve as a current gain stage which drives a resistive load consisting of series-connected resistors 1 to 7 and connected at its other end to a high voltage source 36. A JFET 30 is provided between the current gain stage and the resistive load to form a cascode stage along with the transistor 29 in order to allow this combination to withstand high voltages.

A current source 34 is used to supply a constant current to a current mirror consisting of two transistors 32 and 33. Transistor 32 also forms a cascode stage with a JFET 31. The transistors 31 and 32 are used to deliver bias current to transistors 15 to 21 and, via a bias resistor 22 to transistors 8 to 14 all these components thus forming a buffer stage to provide low impedance at the output 35. The transistors 8 to 21, are supplied by the high voltage source 36 and are connected to form a chain of Darlington pairs 8-15, 9-16, . . . 14-21 by having the transistors in each of the two sets (8-14, 15-21) connected emitter-to-collector, with the collector of the first transistor of each set connected to the high voltage source 36 and the emitter of the last transistor of each set connected to the output 35. The base of each of the transistors 15 to 21 is then connected to the emitter of the respective one of transistors 8 to 14 and the base of each of these transistors is connected to the resistive load consisting of resistors 1 to 7 which thus form a potential divider network for the Darlington pairs.

When the output 35 is near to ground potential the high voltage is distributed across the resistors 1 to 7, across the transistors 8 to 14 and across the transistors 15 to 21. The number of transistors in series each time is chosen such that the voltage across each one does not exceed it's collector-emitter break-down voltage (BVCEO). If this condition is fulfilled there will never be negative base current on these transistors (and hence no stability problems of the resistor-transistor combination). In the output stage shown in FIG. 1, the high voltage is applied each time across seven transistors. Thus the supply voltage 36 may go up to 7×BVCEO before break-down occurs on the NPN transistors.

Each of the resistors 1 to 7 is separately isolated with the individual epitaxial region connected to the positive resistor end. This means that the resistor break-down voltages will be the same as the BVCBO of the NPN transistors. All the devices are formed with sufficient spacing between the buried layer and the channel stopper to guarantee a high break-down voltage between the buried layer and the substrate.

When the output 35 is high (no current through transistor 30) the output voltage should swing close to the positive supply voltage 36. Thus the transistors 8 to 14 should draw no significant base current to cause a voltage drop across the resistors 1 to 7. To keep the base current small even with a load connected to the output 35, transistors 8 to 14 are followed by the further transistor chain 15 to 21 thus increasing the current gain of the buffer amplifier formed by the combination of the two transistor chains. With usual component dimensions the output voltage can get to within about 2 V of the positive supply voltage.

When the output voltage of 35 is high, the high voltage of the source 36 is applied across the devices 29 and 30 and across the devices 31 and 32. Transistors 30 and 31 are epi-JFET devices which have high break-down voltages even when made using a shallow process. The drain to gate break-down voltage and the drain to substrate break-down voltage are both relatively high, e.g. about 50 V and 80 V respectively in this case.

Transistors 30 and 31 are combined with the NPN transistors 29 and 32 respectively in a cascode stage configuration with the gates of the FET's tied to ground. In this way the combination of transistors 29 and 30, for example, can handle high voltages by means of the FET 30 and it has high current gain defined by the NPN transistor 29. As long as the NPN transistor 29 does not saturate, the current of the combination 29, 30 is defined by the NPN transistor 29.

The maximum voltage the collector of transistor 29 might rise to when the collector current goes to zero is the threshold voltage (absolute value) of FET 30 (typically some volts). This means that the combination of the transistors 29 and 30 can only be switched off completely through transistor 24 if the collector-emitter break-down voltage BVCEO of the NPN transistor 29 is greater than the threshold voltage of the FET-device 30.

The above condition however can often not be guaranteed in production since the threshold voltage spread of epi-JFET transistors is relatively high.

Figure 2:
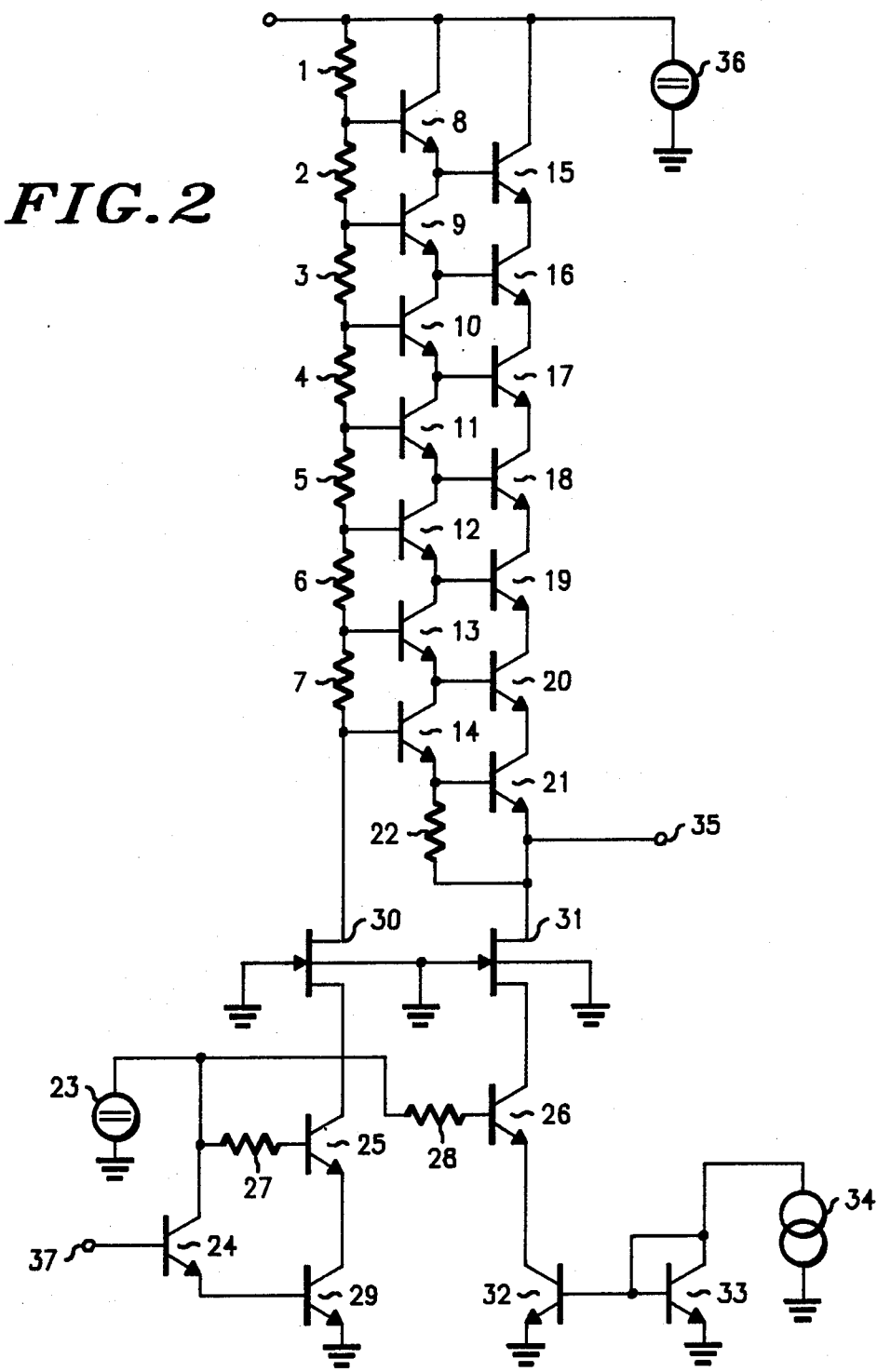
FIG. 2 is a circuit diagram of an improvement to the output stage of FIG. 1.

FIG. 2 shows how one can get around this problem by introducing four more devices. Each of the cascode stages formed by transistors 29, 30 and 31, 32 respectively is provided with a further transistor, 25 and 26 respectively connected between the cascode transistors. Each further transistor 25 and 26 is connected to the low voltage source 23 via resistors 27 and 28 respectively. The highest voltage across the combination of transistors 25 and 29 is again the threshold of the FET. So it is important to know what is maximum voltage the collector of transistor 25 can withstand in combination with the other devices.

With no current through transistor 29 the base voltage of transistor 25 will be very close to the voltage of the voltage source 23. So the maximum voltage the collector of 25 can withstand is the voltage of source 23 plus BVCBO of transistor 25, provided the voltage of source 23 is small enough to prevent CEO-break-down of transistor 29. In the described output stage this maximum voltage is always higher than the threshold voltage of the JFET and hence the break-down voltage of the combination of transistors 29, 25 and 30 is only limited by the drain to gate break-down of the JFET device.

If transistor 29 draws some current from the emitter of transistor 25 the collector-base diode of transistor 25 will withstand somewhat less voltage but at the same time the source voltage of transistor 30 will move down thus compensating for the lower break-down voltage. In any case, the collector to emitter break-down voltage of transistor 25 will be significantly higher than the BVCEO since negative base current can flow through resistor 27.

Similar considerations apply for the transistor combination 32, 26, 31. The breakdown situation is even less critical, however, since there is always current flowing through transistor 31 when the output is high (resulting in a lower source voltage). Thus relatively high negative base current can be tolerated at transistor 26, and transistor 32 can withstand higher voltages than BVCEO.

If the threshold voltages of the FET's 30 and 31 are very low, then the transistors 25 and 26 might be saturated all the time. Resistors 27 and 28 are then needed to allow the bases of transistors 25 and 26 to move down in voltage and hence to allow transistors 29 and 32 to saturate too. By choosing adequate dimensions the minimum voltage of output 35 may go as low as 100 mV.

Figure 3:
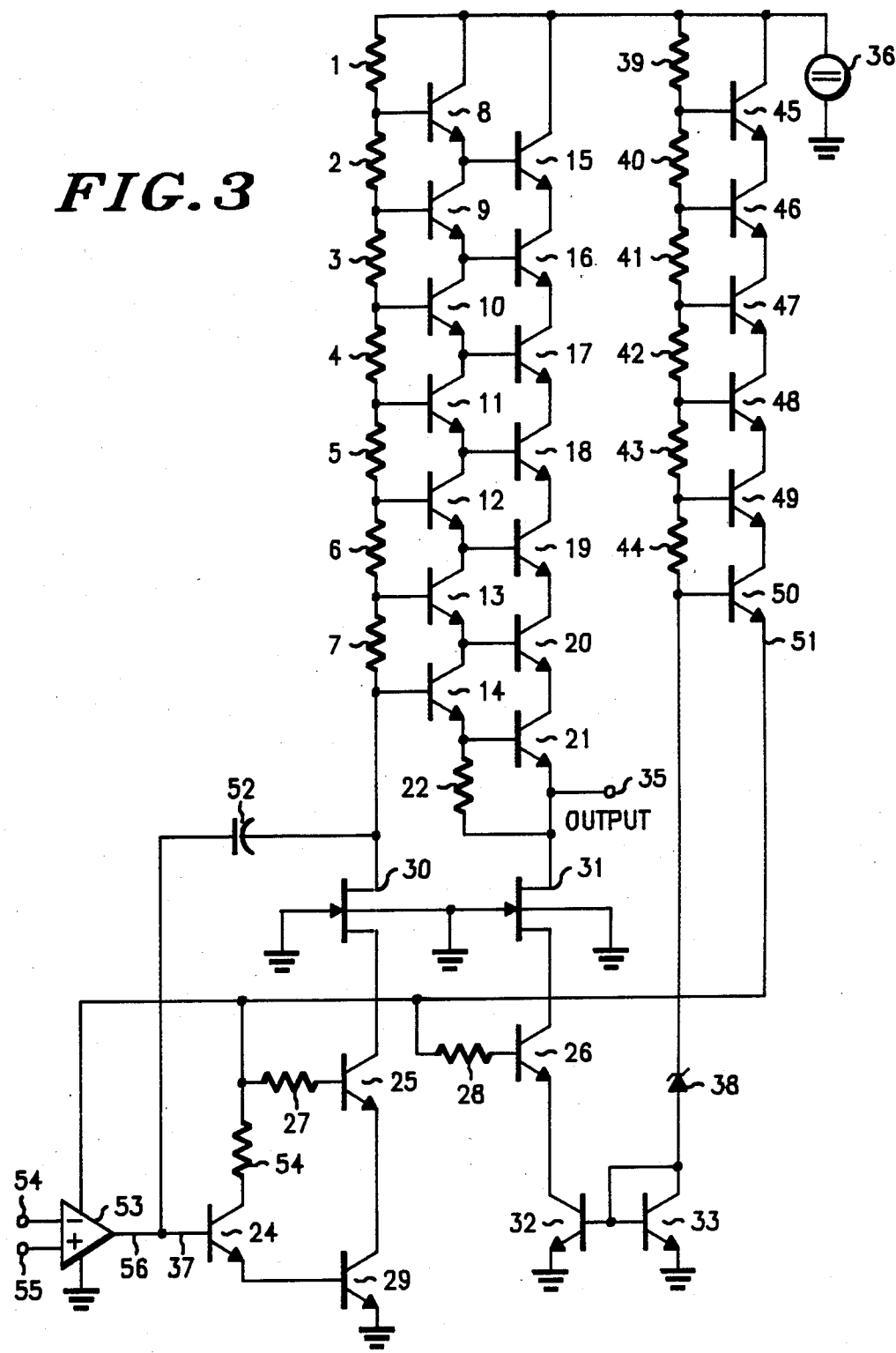
FIG. 3 is a circuit diagram of an operational amplifier incorporating the improved output stage of FIG. 2.

FIG. 3 shows how the output stage can be used to build a complete operational amplifier. A transconductance stage 53 with a differential input (nodes 54 and 55) is used to control the input of the above described output stage. The current source 34 of FIG. 2 is now replaced by a chain of resistors 39 to 44. Transistors 45 to 50 and a Zener diode 38 serve to generate a low supply voltage occuring at the emitter (51) of transistor 50. This voltage replaces the voltage source 23 of FIG. 2 and at the same time supplies the input stage 53. Capacitor 52 is added for frequency compensation. Resistor 54 limits the collector current of transistor 24 in case of saturation.

It will be appreciated that although the current source and the low voltage source are described as chains of resistors and transistors respectively only with respect to the complete amplifier, the current and low voltage sources of FIGS. 1 and 2 may also be replaced by similar chains of resistors and transistors.

We claim:

1. A high voltage amplifier output stage comprising a plurality of low voltage amplifying means connected between a relatively high voltage source and a current source to provide a common output, means for providing a low voltage input to each of the amplifying means, and means including a low voltage transistor connected to supply an input signal to said amplifying means via a high voltage FET which protects said low voltage transistor from high voltages.

2. A high voltage amplifier output stage according to claim 1 which is integrated and wherein said plurality of low voltage amplifying means, said low voltage transistor and said high voltage FET are all produced by a low voltage process.

3. A high voltage amplifier output stage according to claim 1 wherein said high voltage FET is a JFET.

4. A high voltage amplifier output stage according to claim 1 wherein said low voltage transistor and said FET form a first cascode stage.

5. A high voltage amplifier output stage according to claim 1 wherein said plurality of low voltage amplifying means each include a transistor and are connected in a chain and said means for providing a low voltage input to each of the amplifying means comprises a potential divider network connected between the relatively high voltage source and said high voltage FET and having a plurality of taps providing inputs to each of said amplifying means, the number of amplifying means being such that the collector-emitter breakdown voltage of the transistor of each of said amplifying means is not exceeded.

6. A high voltage amplifier output stage according to claim 5 wherein each of said amplifying means comprises a transistor pair.

7. A high voltage amplifier output stage according to claim 6 wherein the Darlington transistor pairs are connected in such a way that the collectors of one Darlington pair are connected to the respective emitters of the next Darlington pair, the collectors of a first Darlington pair being connected to the relatively high voltage source and the emitters of a last Darlington pair being connected to the output.

8. A high voltage amplifier output stage according to claim 7 further comprising a biasing resistor connected between one of the emitters of said last Darlington pair and the output.

9. A high voltage amplifier output stage according to claim 5 wherein said potential divider network comprises a plurality of resistors connected in series and is tapped between the resistors to provide the inputs to the amplifying means.

10. A high voltage amplifier output stage according to claim 1 wherein each of said amplifying means includes a semiconductor amplifying means.

11. A high voltage amplifier output stage according to claim 1 wherein said means for supplying an input signal to said amplifying means further comprises a second transistor whose base is connected to a signal input, whose collector is connected to a low voltage source and whose emitter provides an input to the base of said low voltage transistor.

12. A high voltage amplifier output stage according to claim 1 wherein said current source comprises a chain of resistors connected at one end to said high voltage source.

13. A high voltage amplifier output stage according to claim 1 wherein said current source comprises a chain of transistors and a zener diode, the chain of transistors being supplied from a chain of resistors which serves as a potential divider network providing inputs to the transistors.

14. An operational amplifier incorporating a high voltage amplifier output stage comprising a plurality of low voltage amplifying means connected between a relatively high voltage source and a current source to provide a common output, means for providing a low voltage input to each of the amplifying means, and means including a low voltage transistor connected to supply an input signal to said amplifying means via a high voltage FET which protects said low voltage transistor from high voltages and a transconductance stage having a differential input, the output of the transconductance stage providing an input to the high voltage amplifier output stage.

15. A high voltage amplifier output stage comprising a plurality of low voltage amplifying means connected between a relatively high voltage source and a current source to provide a common output, means for providing a low voltage input to each of the amplifying means, means including a low voltage transistor connected to supply an input signal to said amplifying means via a high voltage FET which protects said low voltage transistor from high voltages, said low voltage transistor and said high voltage FET forming a first cascode stage, and a second cascode stage connected between said plurality of low voltage amplifying means and the current source.

16. A high voltage amplifier output stage according to claim 15 wherein the second cascode stage comprises a JFET and a bipolar transistor, the bipolar transistor forming part of a current mirror provided between said current source and the JFET.

17. A high voltage amplifier output stage according to claim 16 further comprising a further transistor in the first cascode stage between the FET and said low voltage transistor, the base of said further transistor being connected to a low voltage source via a resistor.

18. A high voltage amplifier output stage according to claim 17 comprising a second further transistor in the second cascode stage between the JFET and the bipolar transistor, the base of the second further transistor being connected to the low voltage source via a resistor.

* * * * *